United States Patent [19]

Sanwo et al.

[11] Patent Number: 4,992,678

[45] Date of Patent: Feb. 12, 1991

[54] HIGH SPEED COMPUTER DATA TRANSFER SYSTEM

[75] Inventors: Ikuo J. Sanwo, San Marcos; Gregory H. Milby, San Diego; Moo Y. Kim, Escondido, all of Calif.

[73] Assignee: NCR Corporation, Dayton, Ohio

[21] Appl. No.: 284,644

[22] Filed: Dec. 15, 1988

[51] Int. Cl.[5] .................... H03K 19/094; H03K 5/153
[52] U.S. Cl. ...................................... 307/451; 307/443; 307/452; 307/480; 307/481; 307/351; 307/362; 307/546; 365/203; 365/205
[58] Field of Search ................ 307/443, 448, 451–452, 307/480–481, 584–585, 264, 351, 362, 546; 365/203, 205

[56] References Cited

U.S. PATENT DOCUMENTS

| | | | |
|---|---|---|---|
| 4,488,066 | 12/1984 | Shoji | 307/452 |
| 4,498,021 | 2/1985 | Uya | 307/443 |
| 4,572,972 | 2/1986 | Shoji | 307/303 |
| 4,598,216 | 7/1986 | Lauffer et al. | 307/443 |
| 4,670,666 | 6/1987 | Yoshida | 307/481 |
| 4,761,567 | 8/1988 | Walters, Jr. et al. | 307/269 |
| 4,763,023 | 8/1988 | Spence | 307/480 |
| 4,772,888 | 9/1988 | Kimura | 307/480 |

Primary Examiner—Stanley D. Miller
Assistant Examiner—Margaret Rose Wambach
Attorney, Agent, or Firm—Wilbert Hawk, Jr.; Stephen F. Jewett; Gregory P. Gadson

[57] ABSTRACT

A high speed computer data transfer system includes a clamping circuit for limiting pre-charge voltages in the case where multiple pre-charge cycles occur before a pull-down operation. Data bus voltage swings between logic high and logic low levels as well as pull-down times are reduced, thus lowering the time needed to transfer the data. The preferred embodiment is implemented using complementary metal-oxide-semiconductor (CMOS) technology.

9 Claims, 3 Drawing Sheets

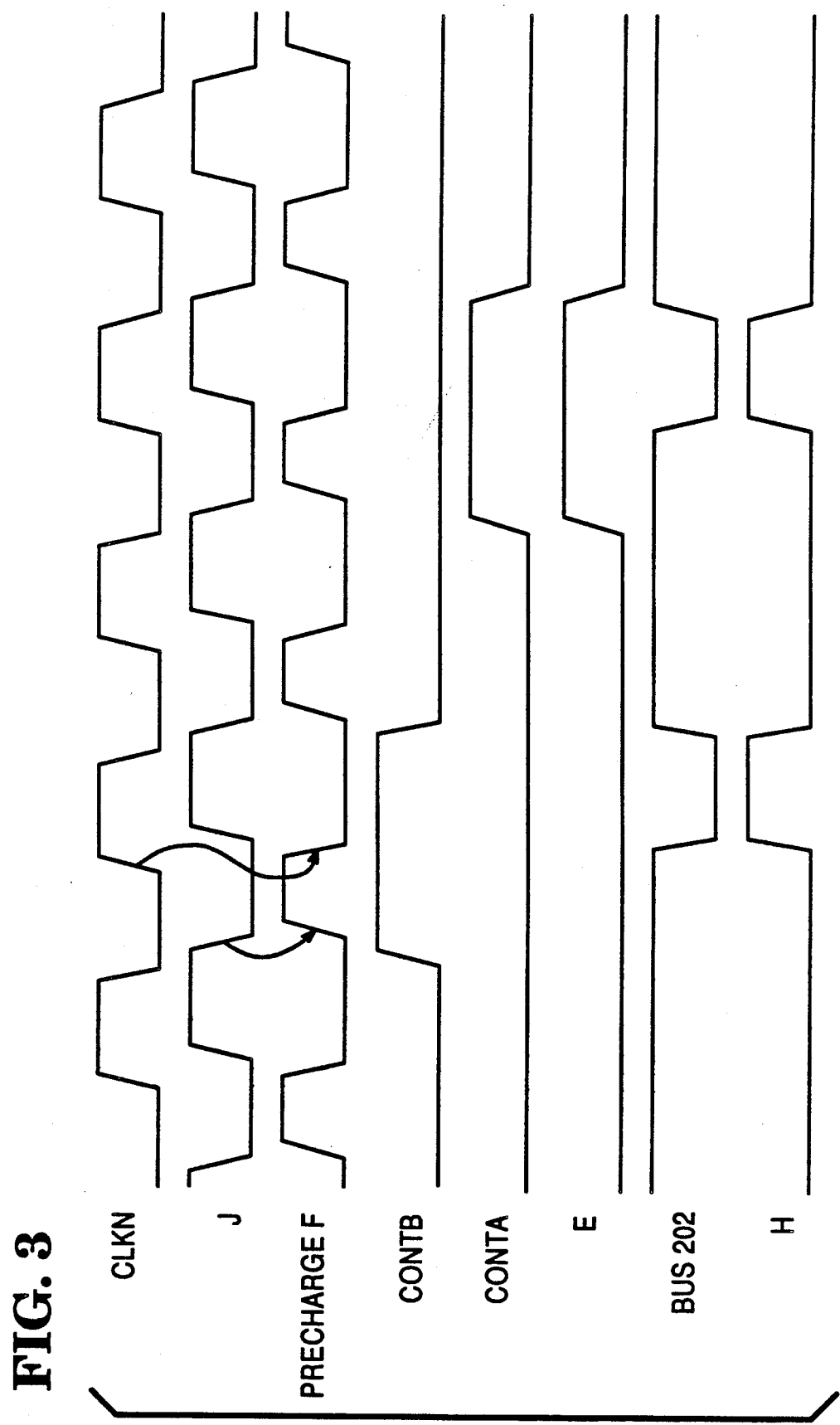

HIGH SPEED COMPUTER DATA TRANSFER SYSTEM

FIELD OF THE INVENTION

The present invention generally relates to computer data transfer systems, and more particularly to means for increasing the data transfer speed of data buses suitable for use in microprocessor chips.

BRIEF DESCRIPTION OF THE DRAWINGS

FIG. 3 shows signal waveforms at selected places in the circuit of FIG. 2.

BACKGROUND OF THE INVENTION

Figure 1:
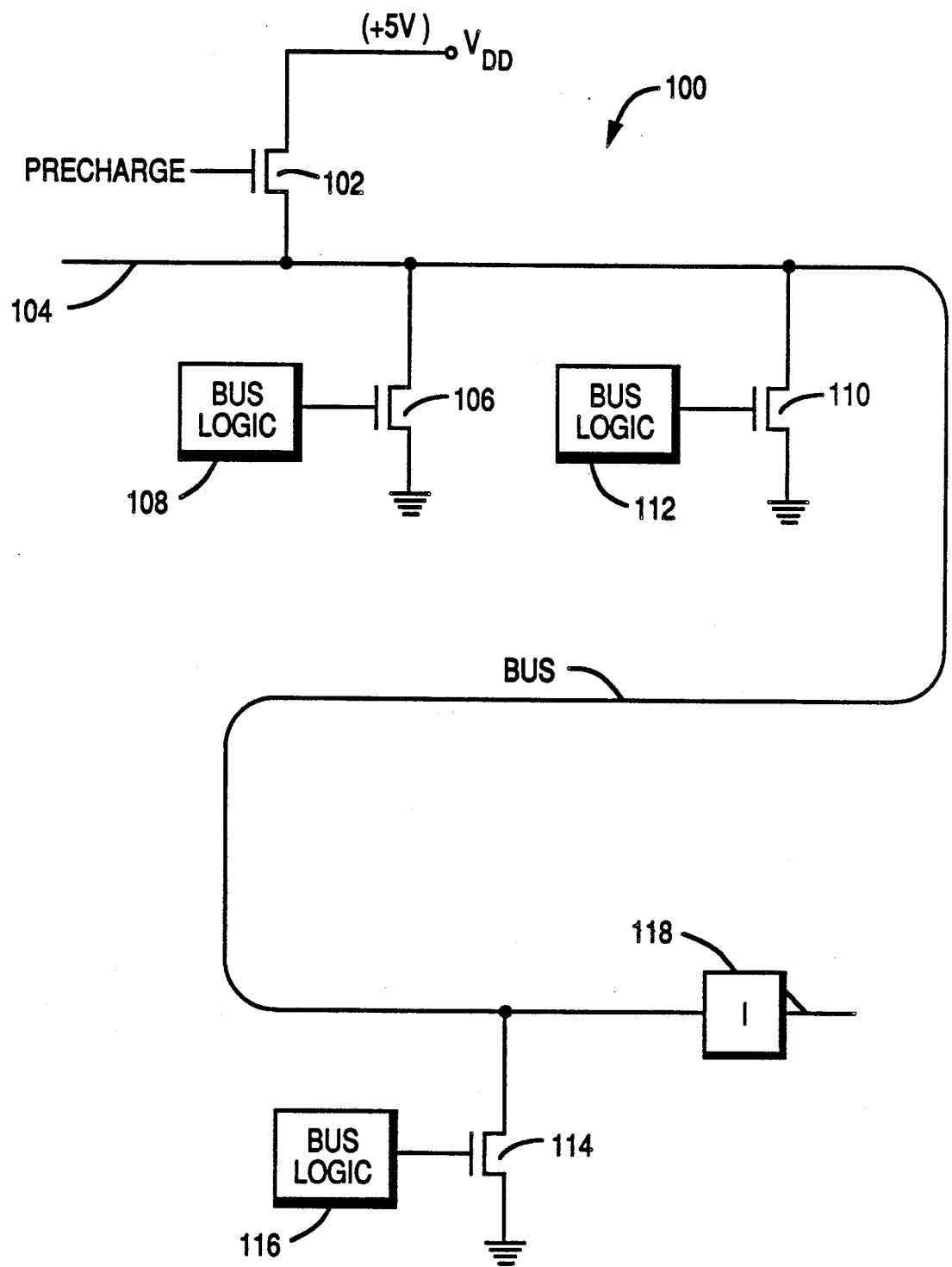
FIG. 1 is a generalized schematic diagram of a prior art data transfer system.

Prior art data transfer systems, such as the system 100 in FIG. 1, often contain a pre-charging transistor 102 coupled to the data bus 104 for precharging the bus 104 to a logic high level (e.g., 5 volts). This approach normally assumes that it is faster to pull the bus voltage down to a logic low level (e.g., 0 volts) from the logic high level, than the reverse. The pull-down transistors 106, 110 and 114 with their respective bus logic 108, 112 and 116 are operated to pull the bus voltage down to the logic low level by creating conduction paths to ground when activated.

The bus 104 is maintained at a logic high voltage, which voltage is nearly instantaneously available at an input of an inverter 118. The bus 104 is pulled down when a logic low voltage is to be provided to the inverter 118. Pre-charging can thus increase the operating speed of data transfer systems.

However, repeated pre-charging cycles without the intervention of a pull-down operation can raise the pre-charge voltage to such a high level that the overall advantage of pre-charging is lost since the time for going from the logic high voltage to the logic low voltage is directly proportional to the precharge voltage.

SUMMARY OF THE INVENTION

It is an object of the present invention to provide a data transfer system with high data transfer speed.

It is also an object of the present invention to decrease bus transition times for changing from the pre-charge voltage level to the pull-down voltage level.

It is another object of the present invention to implement such a data transfer system using complementary metal-oxide-semiconductor (CMOS) technology.

It is yet another object of the present invention to implement a data transfer system meeting the above objects in a microprocessor chip.

There is provided in accordance with the present invention a high speed computer data transfer system for transferring digital data. The system has a data transfer bus, a pre-charger connected to the data transfer bus for pre-charging the bus to a voltage representative of a first logic level, and a pulling circuit connected to the data transfer bus for pulling the bus from the first logic level to a voltage representative of a second logic level. Additionally, the system has a clamping circuit connected to the data transfer bus for preventing the bus from exceeding a threshold voltage during pre-charging, whereby the time for transition from the first logic level to the second logic level is decreased.

The details of the present invention will be revealed in the following description with reference to the aforementioned drawings.

DESCRIPTION OF THE PREFERRED EMBODIMENT

Figure 2:
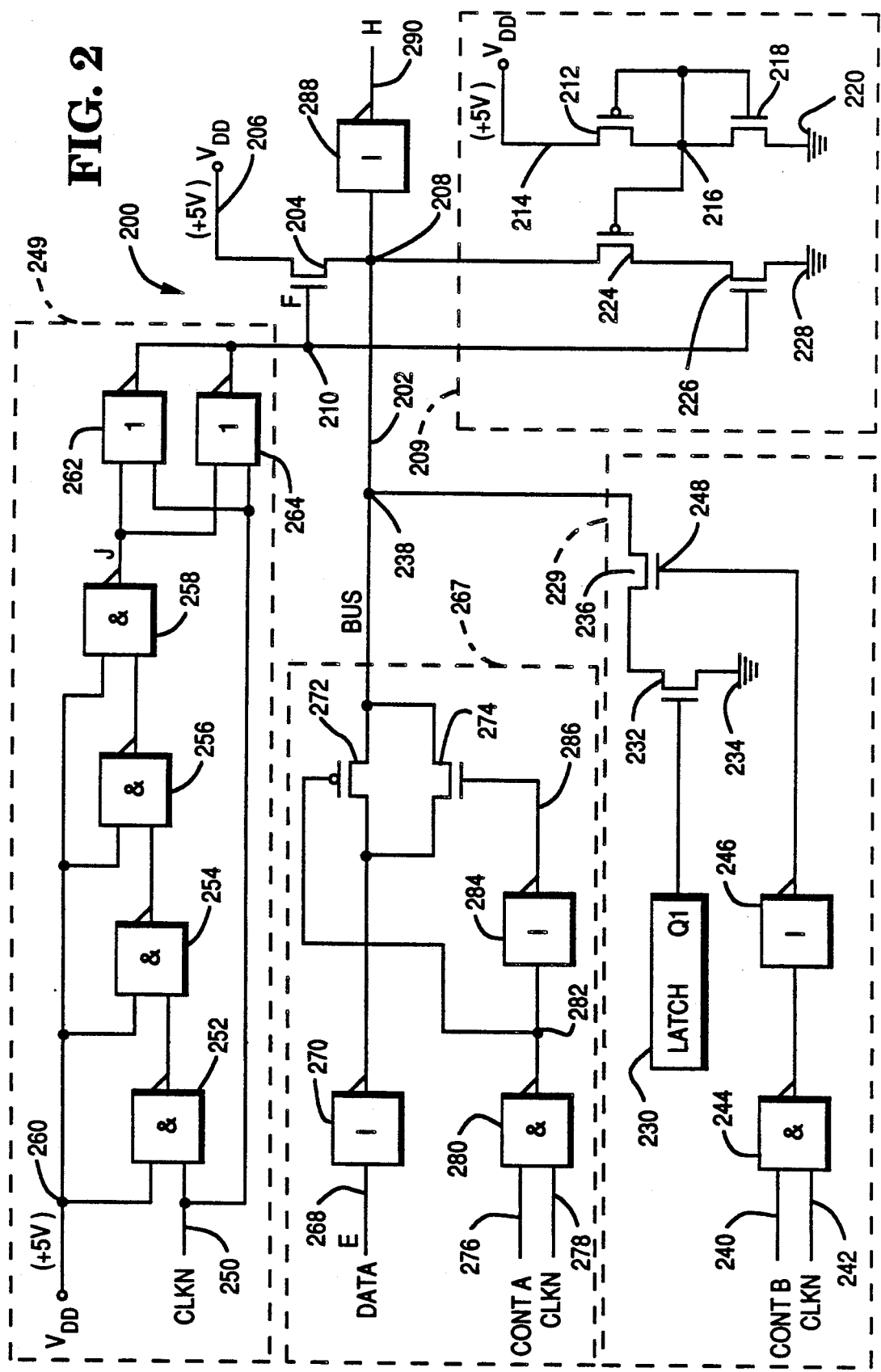
FIG. 2 is a detailed schematic diagram of the present inventive data transfer system.

FIG. 2 shows the preferred embodiment for a high speed computer data transfer system 200 implemented using CMOS technology and having a data transfer bus 202 that transfers data in the form of logic high and logic low voltages. All transistors are of the junction field-effect type (JFET), with a bubble at the gate indicating a p-channel device, and the absence of a bubble at the gate indicating an n-channel device.

A pre-charge transistor or pre-charger 204 is connected at its drain to a 5 volt power source $V_{DD}$ at 206, which power source is controllably transferred to pre-charge the bus 202. The source of the transistor 204 is connected to the bus 202 at node 208 while its gate is connected at 210 to a combination pre-charge control and delay circuit 249, to be detailed infra.

A pair of transistors 212 and 218 serve as a bias voltage setter in a clamping circuit 209. They are joined at their gates and drains via node 216. The transistor 212 is connected at its source to the 5 volt power source $V_{DD}$ at 214, while the source of the transistor 218 is connected to ground at 220. In the preferred embodiment the bias voltage (at node 216) is set at approximately 2.5 volts.

A clamping transistor 224 is connected at its gate to node 216 from whence its bias voltage is supplied. The clamping transistor 224 is also connected at its source to the bus 202 and at its drain to the drain of a regulating transistor 226. Connected to ground at 228, the transistor 226 conducts to allow charges from the clamping transistor 224 to clamp the bus voltage only when an enabling signal (signifying the beginning of a pre-charging cycle) is received at its gate from node 210. As indicated supra, the enabling voltage at 210 also controls the pre-charger 204. Whenever the bus voltage exceeds the bias (or threshold) voltage during a pre-charge cycle, both transistors 224 and 226 conduct to remove excess charges, thereby clamping the bus voltage. The remaining components of the system 200 will now be described.

A pull-down circuit 229 pulls the bus voltage down to a logic low level when desired, and operates as follows. A latch 230 temporarily stores data to be transferred onto the data bus 202. A transistor 232 connected at its source to ground at 234 is capable of pulling the bus voltage down from the logic high voltage level to the logic low voltage level when the latched data (connected to the gate of the transistor 232) is a logic high value. However, transistor 236, connected to the bus 202 at node at 238, only allows pulling-down during positive clock cycles when a control signal CONT B indicates that pulling-down is to occur.

The pull-down control signal CONT B and the clock signal CLKN form inputs 240 and 242 of a NAND gate 244. The output signal of the NAND gate 244 is inverted by an inverter 246, and is then transferred to the gate 248 of the transistor 236 to control the transfer of data.

The clock signal CLKN is also applied via input 250 to a series of NAND gates 252–258, which form part of the pre-charge control and delay circuit 249. As shown, the second input of the NAND gate 252 is connected to the power source $V_{DD}$ at 260. Both the clock signal and the output signal of the NAND gate 258 are applied to a NOR gate 262. Similarly, the clock signal and the output of NAND gate 258 are also applied to the inputs of a second NOR gate 264. The NOR gates 262 and 264 are connected at their outputs to node 210, and serve as drivers for the pre-charge transistor 204.

The series of NAND gates 252-258 are included in the circuit so that data selected can be completely transferred prior to the onset of the pre-charging cycles. In other words, the pre-charging cycles do not begin until after the end of the falling edge of the clock signal. This prevents the disturbance of a data transfer by the pre-charger 204.

Data at input 268 (also shown as point E in FIG. 2) is inverted by an inverter 270 which serves as a bus driver, and is selectively transferred by a CMOS driver circuit 267 having a CMOS switch made of transistors 272 and 274. The operation of the CMOS driver circuit 267 is controlled by the combination of a control signal CONT A at 276 and the clock signal CLKN at 278, both of which are inputs to a NAND gate 280. The output of the NAND gate 280 is connected to the gate of the transistor 272 and to an inverter 284. The output of the inverter 284 is applied to the gate 286 of the transistor 274. A logic high control signal at 276 causes the CMOS switch to conduct when the clock signal has a logic high value. Likewise, a logic low control signal halts conduction of the CMOS switch.

The CMOS driver circuit 267 illustrates how the bus 202 can be driven by input driver circuits other than pull-down circuits, such as the pull-down circuit 229. The CMOS driver circuit 267 has the ability to drive the voltage level of the bus 202 either high or low. In those cases where the high voltage introduced by the CMOS switch exceeds the bus threshold voltage (2.5 volts) the clamping circuit 209 is activated to clamp the bus voltage in the same manner as when the pre-charge voltage alone exceeds the threshold voltage. Although only one CMOS driver circuit 267 and one pull-down circuit 229 are shown in FIG. 2, it will be appreciated by those skilled in the art that additional driver and pull-down circuits may be connected to the data transfer bus 202.

Data transferred by the data transfer system 200 is inverted by an inverter 288 prior to being output at the data transfer system output 290.

FIG. 3 includes timing diagrams for signal waveforms corresponding to selected locations in the circuit of FIG. 2. Briefly stated, the signal waveforms are, beginning at the top of FIG. 3, the clock signal CLKN, the output signal of the NAND gate 258 at point J, the pre-charge control signal at point F, the control signal labeled CONT B, the control signal labeled CONT A, the data input at point E, the signal on the bus 202, and the output signal at point H.

Variations and modifications to the present invention are possible given the above disclosure. However, such variations and modifications are intended to be within the scope of the invention claimed by this letters patent.

We claim:

1. A high speed computer data transfer system for transferring digital data comprising:
   a data transfer bus;
   a pre-charger coupled to said bus for precharging said bus to a first logic level;
   a pulling circuit coupled to said bus for pulling said bus from said first logic level to a second logic level; and
   a clamping circuit coupled to said bus for preventing said bus from exceeding a threshold voltage during pre-charging, said clamping circuit providing a low impedance path from said bus to said threshold voltage when activated, whereby the time for transition from the first logic level to the second logic level is decreased.

2. The data transfer system in claim 1 wherein said system is implemented using complementary metal-oxide-semiconductor (CMOS) technology.

3. The data transfer system in claim 2 wherein said clamping circuit comprises:
   a bias voltage setter for setting a bias voltage; and
   a clamping transistor coupled at its source to said bus and coupled at its gate to said bias voltage setter, said clamping transistor conducting when the voltage on said bus exceeds said bias voltage.

4. The data transfer system in claim 3 wherein pre-charging occurs only during pre-defined pre-charging intervals, and said clamping circuit further comprises:
   a clamping regulator transistor coupled to the drain of said clamping transistor, for conducting and hence allowing clamping to occur only during said pre-charging intervals.

5. The data transfer system in claim 3 wherein said bias voltage setter comprises two series coupled transistors of complementary conductivity type.

6. The data transfer system in claim 4 wherein said bias voltage setter comprises two series coupled transistors of complementary conductivity type.

7. The data transfer system in claim 1 further comprising a driver circuit coupled to said bus for inputting data in the form of logic high and logic low signals.

8. The data transfer system in claim 7 wherein said driver circuit comprises a CMOS switch.

9. The data transfer system in claim 1 further comprising a pre-charge control and delay circuit coupled to said pre-charger for activating said pre-charger after a current data transfer cycle is complete.

* * * * *